(12) United States Patent
Oshima et al.

(10) Patent No.: US 9,529,024 B2
(45) Date of Patent: Dec. 27, 2016

(54) ALTERNATING CURRENT POWER MEASURING APPARATUS

(75) Inventors: Hirotaka Oshima, Kawasaki (JP); Takayuki Ambe, Kawasaki (JP); Akio Ito, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 686 days.

(21) Appl. No.: 13/405,650

(22) Filed: Feb. 27, 2012

(65) Prior Publication Data

US 2012/0259565 A1   Oct. 11, 2012

(30) Foreign Application Priority Data

Apr. 6, 2011 (JP) ................................ 2011-084791
Sep. 14, 2011 (JP) ................................ 2011-201060

(51) Int. Cl.
*G01R 21/06*   (2006.01)
*G01R 21/133*   (2006.01)

(52) U.S. Cl.
CPC .......... *G01R 21/06* (2013.01); *G01R 21/1331* (2013.01)

(58) Field of Classification Search
CPC .................................................... G01R 21/133
USPC ........................................................ 702/61
See application file for complete search history.

(56) References Cited

U.S. PATENT DOCUMENTS 5,473,244 A * 12/1995 Libove ..................... G01R 1/22
                                            324/126
5,519,300 A * 5/1996 Leon ..................... G01R 31/343
                                            318/729
6,498,499 B1* 12/2002 Sikora ................ G01R 27/2605
                                            324/661

(Continued)

FOREIGN PATENT DOCUMENTS

CN       1087998 A   *  9/1993
CN       1087998     *  6/1994

(Continued)

OTHER PUBLICATIONS

First Office Action issued Feb. 8, 2014 in counterpart application No. 201210096489.8 from The State Intellectual Property Office of the People's Republic of China with English translation.

(Continued)

*Primary Examiner* — Manuel L Barbee
*Assistant Examiner* — Raymond Nimox
(74) *Attorney, Agent, or Firm* — Kratz, Quintos & Hanson, LLP (57) ABSTRACT

An alternating current power measuring apparatus includes a first capacitance element having one end connected to a conductor wire of a first electrical cable of a set of electrical cables for supplying alternating current to a load and having the other end capacitively coupled to a conductor wire of a second electrical cable, a first voltage measuring part which measures a first voltage which is a voltage of both ends of the first capacitance element, a first current measuring part (Continued)

which measures a first current flowing in the first electrical cable, and a processing part which computes a power to be supplied to the load by the set of electrical cables by the multiplication among a proportion between a specified voltage value of a voltage applied to the set of electrical cables and an effective value of the first voltage, the first voltage and the first current.

9 Claims, 7 Drawing Sheets

(56) References Cited

U.S. PATENT DOCUMENTS

| | | | | |
|---|---|---|---|---|
| 2002/0167303 | A1* | 11/2002 | Nakano | G01R 31/312 324/126 |
| 2002/0171433 | A1* | 11/2002 | Watanabe | G01R 15/16 324/539 |
| 2003/0067736 | A1* | 4/2003 | Vahamaki | G01R 15/144 361/306.1 |
| 2010/0277417 | A1* | 11/2010 | Sarasmo | 345/173 |
| 2010/0318306 | A1* | 12/2010 | Tierney | G01D 4/002 702/62 |

FOREIGN PATENT DOCUMENTS

| | | |
|---|---|---|
| JP | 11-133065 | 5/1999 |
| JP | 11-133065 A | 5/1999 |
| JP | 2001-255342 A1 | 9/2001 |
| JP | 2003-014791 A | 1/2003 |
| JP | 2005-140506 * | 6/2005 |
| JP | 20050140506 * | 6/2005 |
| JP | 4251961 B2 | 1/2009 |
| JP | 2009-041925 A | 2/2009 |
| WO | 94/07149 | 3/1994 |

OTHER PUBLICATIONS

Notification of Reason(s) for Refusal of Corresponding Japanese Patent Application No. 2011-201060 dated Feb. 3, 2015 with partial English Translation.

* cited by examiner

ALTERNATING CURRENT POWER MEASURING APPARATUS

CROSS-REFERENCE TO RELATED APPLICATIONS

This application is based upon and claims the benefit of priority of the prior Japanese Patent Application No. 2011-84791, filed on Apr. 6, 2011, and the Japanese Patent Application No. 2011-201060, filed on Sep. 14, 2011, the entire contents of which are incorporated herein by reference.

FIELD

The embodiment discussed herein is related to an alternating current power measuring apparatus.

BACKGROUND

The actual electrical power consumption (effective power) of a load of an electrical apparatus or others is given by a product between the apparent power and the power factor.

To obtain a power factor, the information of a phase difference between a voltage and a current is required.

For this reason, when obtaining for the effective power, measuring by connecting the terminal of a measuring apparatus to an conductor wire of an electrical cable directly is commonly done.

Related reference is as follows:
Japanese Laid-open Patent Publication No. 2001-255342;
Japanese Patent No. 4251961; and
Japanese Laid-open Patent Publication No. Hei 11-133065.

SUMMARY

According to an aspect of an embodiment, an alternating current power measuring apparatus including a first capacitance element having one end capacitively coupled to a conductor wire of a first electrical cable of a set of electrical cables for supplying alternating current to a load and having the other end capacitively coupled to a conductor wire of a second electrical cable of the set of electrical cables; a first voltage measuring part for measuring a first voltage which is a voltage of both ends of the first capacitance element; a first current measuring part for measuring a first current flowing in the first electrical cable; and a processing part which computes a power to be supplied to the load by said the set of electrical cables by multiplication among a proportion between a specified voltage value of the voltage applied to the set of electrical cables and an effective value of the first voltage, the first voltage, and the first current.

According to another aspect of the embodiment, an alternating current power measuring apparatus including a first capacitance element having one end capacitively coupled to a conductor wire of a first electrical cable of a set of three electrical cables for supplying three-phase alternating current to a load and having the other end capacitively coupled to a conductor wire of a second electrical cable of the set of electrical cables; a second capacitance element having one end capacitively coupled to a conductor wire of a third electrical cable of the set of electrical cables and having the other end capacitively coupled to the conductor wire of the second electrical cable; a first voltage measuring part for measuring a first voltage which is a voltage of both ends of the first capacitance element; a second voltage measuring part for measuring a second voltage which is a voltage of both ends of the second capacitance element; a first current measuring part for measuring a first current flowing in the first electrical cable; a second current measuring part for measuring a second current flowing in the second electrical cable; a switching part for capacitively coupling selectively either of said other end of the first capacitance element and said other end of the second capacitance element to the second electrical cable; and a processing part which computes a first value by a multiplication among a proportion between a specified voltage value of a voltage applied to the set of electrical cables and an effective value of the first voltage, the first voltage and the first current, by measuring the first voltage and the first current with capacitively coupling said the other end of the first capacitance element to the second electrical cable by the switching part, and which computes a second value by a multiplication among a proportion between the specified voltage value and an effective value of the second voltage, the second voltage and the second current, by measuring the second voltage and the second current with capacitively coupling said the other end of the second capacitance element to the second electrical cable by the switching part, and which computes a power to be supplied to the load by the set of electrical cables by summation of the first value and the second value.

The object and advantages of the embodiments will be realized and attained by means of the elements and combinations particularly pointed out in the claims.

It is to be understood that both the foregoing general description and the following detailed description are exemplary and explanatory and are not restrictive of the embodiments, as claimed.

DESCRIPTION OF EMBODIMENTS

When the measurement terminal of a measuring apparatus is connected to the conductor wire of the electrical cable, there was a case that the power supply, etc. for the load turned off for the purpose of securing safety, etc.

Preferred embodiments of the present invention will be explained with reference to accompanying drawings.

[a] One Embodiment

Figure 1:
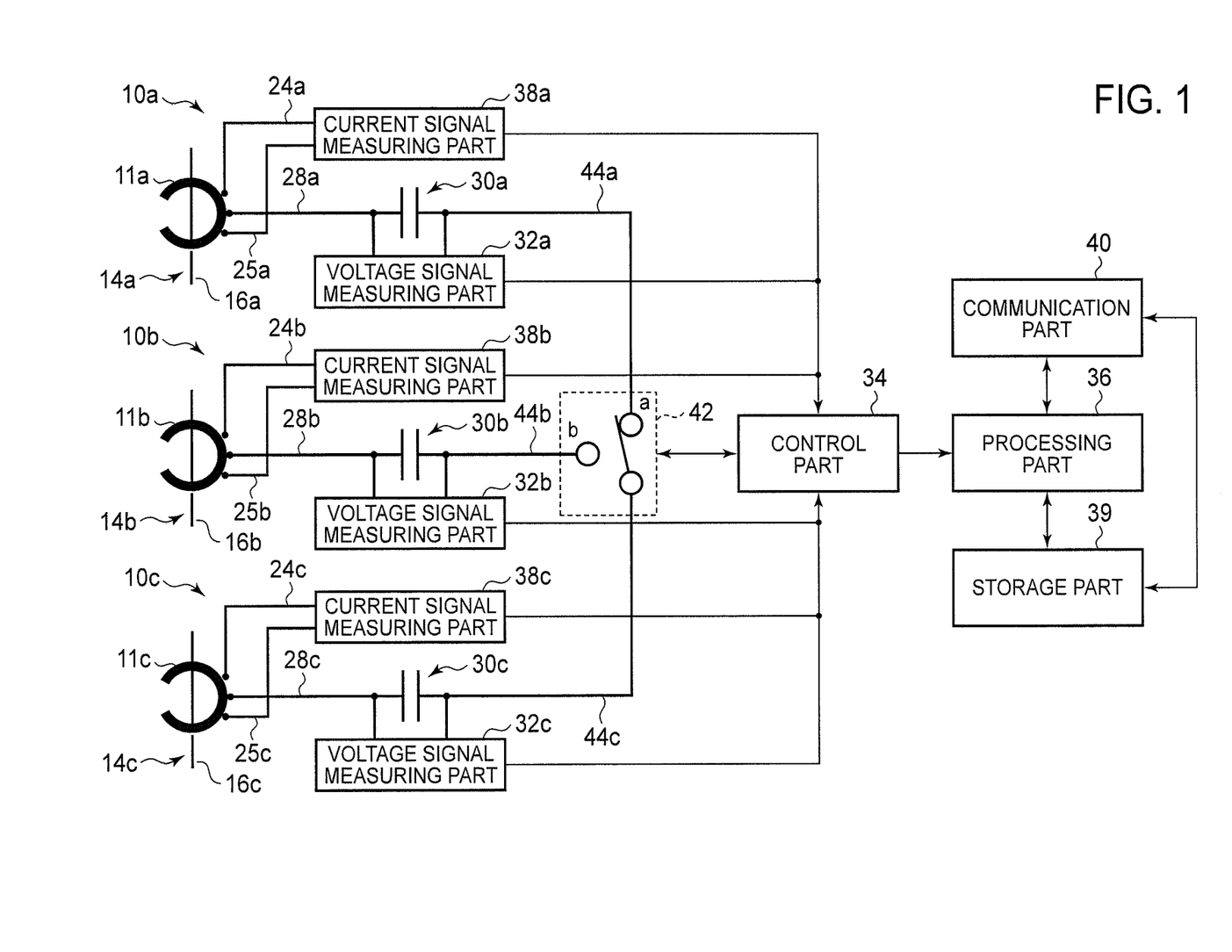
FIG. 1 is a circuit diagram of the alternating current power measuring apparatus according to one embodiment.
Figure 2:
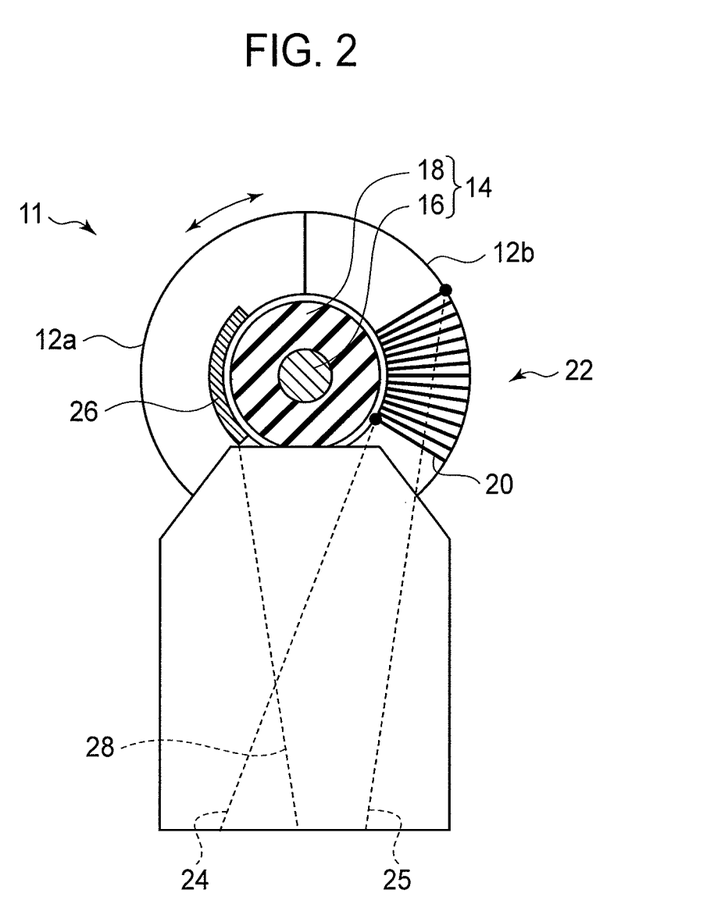
FIG. 2 is a view of an example of a clamp part.

The alternating current power measuring apparatus according to one embodiment will be described with reference to FIGS. 1 to 7. FIG. 1 is a circuit diagram of the alternating current power measuring apparatus according to the present embodiment. FIG. 2 is a view exemplifying the clamp part.

In the present embodiment, as illustrated in FIG. 1, the alternating current power measuring apparatus includes three input circuits 10a-10c is illustrated. The three input circuits 10a-10c are provided so that not only the single-phase alternating current but also three-phase alternating current can be measured. When three-phase alternating current is measure, the three input circuits are used for the measurement, and the two input circuits are used for measuring single-phase alternating current.

The case that power of three-phase alternating current is measured on a load (not illustrated) is illustrated here.

First, an example of the clamp part 11 used in the present embodiment will be described with reference to FIG. 2.

A main body (support part) of the clamp part 11 supports a pair of magnetic cores 12a, 12b. At least one of the pair of magnetic cores 12a, 12b is movable. For example, the magnetic core 12a can be movable in the arrowed directions in FIG. 2. Each magnetic core 12a, 12b is formed in, e.g., a semi-annular shape.

The clamp part 11 is for clamping an electrical cable (power cable, insulated wire, insulated conductor) 14 for supplying alternating current power source. The electrical cable 14 has the conductor wire (lead wire, electrical lead, conductor) 16 coated by an insulator 18. FIG. 2 illustrates the state that the electrical cable 14 clamped by the pair of magnetic cores 12a, 12b.

When the electrical cable 14 is clamped by the pair of magnetic cores 12a, 12b of the clamp part 11, both ends of the magnetic core 12a and the both ends of the magnetic core 12b are opposed respectively to each other, and the electrical cable 14 is enclosed by an annular-shaped magnetic path.

As the material of the magnetic cores 12a, 12b, a magnetic material of high magnetic permeability is used. More specifically, as the material of the magnetic cores 12a, 12b, ferrite, silicon steel plate, permalloy or others.

A wire 20 is wound around the magnetic core 12b, thereby a coil 22 is formed. The coil 22 is used to measure a current flowing in the electrical cable 14. The current flowing in the electrical cable 14 can be detected by detecting by the coil 22 a magnetic flux flowing in the annular-shaped magnetic path formed by the pair of magnetic cores 12a, 12b. Lead-out lines (interconnections, signal lines) 24, 25 are lead out respectively from both ends of the coil 22.

An electrode (conductor) 26 is provided on the inside of the magnetic core 12a. The electrode 26 is used to measure the voltage of the electrical cable 14. The clamp part 11 has the mechanism for pressing the electrode 26 against the insulator 18 of the electrical cable 14 when the clamp part 11 clamps the electrical cable 14. Accordingly, the electrode 26 is adjacent to or contacts the insulator 18 of the electrical cable 14 when the clamp part 11 clamps the electrical cable 14. As the material of the electrode 26, copper (Cu), for example, is used. Form the electrode 26, a lead-out line (interconnection, signal line) 28 is led out.

As illustrated in FIG. 1, the respective input circuits 10a-10c include the clamp parts 11a-11c. As the clamp part 11a-11c, the clamp part 11 as illustrated in FIG. 2, for example, is used.

The respective input circuit 10a-10c include capacitance elements (capacitors) 30a-30c. The electrodes 26 of the clamp parts 11a-11c and one ends of the capacitance elements 30a-30c are electrically connected by the interconnections 28a-28c.

When electrical cables 14a-14c are clamped by the clamp parts 11a-11c, one ends of the capacitance elements 30a-30c are capacitively coupled respectively to the electrical cables 14a-14c.

With the contact of a switch 42 to be described later set on the a-side, the end of the capacitance element 30a is capacitively coupled to the conductor wire 16c of the electrical cable 14c via the capacitance element 30c.

On the other hand, with the contact of the switch 42 to be described later set on the b-side, the end of the capacitance element 30b is capacitively coupled to the conductor wire 16c of the electrical cable 14c via the capacitance element 30c.

When the electrostatic capacitance $C_0$ between the conductor wires 16a-16c of the electrical cables 14a-14c and the electrodes 26 of the clamp parts 11a-11c is, e.g., about 10 pF, the electrostatic capacitance $C_1$ of the capacitance elements 30a-30c is set at, e.g., about 10 nF. Preferably, the electrostatic capacitance $C_1$ of the capacitance elements 30a-30c is not excessively larger for the electrostatic capacitance $C_0$ between the conductor wires 16a-16c and the electrodes 26. This is to ensure that the voltage to be applied to both ends of the capacitance elements 30a-30c is high.

To the respective capacitance elements 30a-30c, voltage signal measuring parts (voltage signal detecting parts, voltage measuring parts) 32a-32c are connected. The voltage signal measuring parts 32a-32c respectively measure the voltages of both ends of the capacitance elements 30a-30c. The voltage signal measuring parts 32a-32c measures instantaneous values of the voltages on both ends of the capacitance elements 30a-30c sequentially at a prescribed time interval. That is, the voltage signal measuring parts 32a-32c can measure instantaneous values of the voltages of both ends the capacitance elements 30a-30c sequentially with a prescribed time resolution. The frequency of the alternating current source is, e.g., 50 Hz or 60 Hz. The time interval of measuring the voltages of both ends of the capacitance elements 30a-30c by the voltage signal measuring parts 32a-32c is set at, e.g., about 200 μs. By measuring the voltages of both ends of the capacitance elements 30a-30c at such time interval, voltage signals (voltage signal data) of a sufficient time resolution can be given.

Preferably, the input impedance of the voltage signal measuring parts 32a-32c is sufficiently large to the impedance of the capacitance elements 30a-30c. The input impedance of the voltage signal measuring parts 32a-32c is set sufficiently large so as to prevent the occurrence of phase shifts in the voltage to be applied to both ends of the capacitance elements 30a-30c while preventing the excessive decrease of the voltage to thereby ensure sufficient measurement accuracy. For example, the input impedance of the voltage signal measuring parts 32a-32c is set at, e.g., twice or more of the impedance of the capacitance elements 30a-30c. More preferably, the input impedance of the voltage signal measuring parts 32a-32c is set at, e.g., five times or more of the impedance of the capacitance elements 30a-30c.

The measurement of the voltage by the voltage signal measuring parts 32a-32c is controlled by a control part 34. The voltage signal measuring parts 32a-32c obtain voltage signal data according to a command from the control part 34 and output obtained voltage signal data to the control part 34.

The control part 34 outputs the voltage signal data obtained by the voltage signal measuring parts 32a-32c to a processing part (data analyzing part, CPU) 36.

In the respective input circuits 10a-10c, current signal measuring parts (current signal detecting parts, current measuring parts) 38a-38c are provided. The signal lines 24a-24c, 25a-25c connected to both ends of the coils 22 are connected respectively to the current signal measuring parts 38a-38c. The current signal measuring parts 38a-38c measure currents flowing in the electrical cables 14a-14c, based on signals detected by the coils. The current signal measuring parts 38a-38c measures the instantaneous values of currents flowing in the electrical cables 14a-14c sequentially at a prescribed time interval. Accordingly, the current signal measuring parts 38a-38c can measure the instantaneous values of the currents flowing the in the electrical cables 14a-14c sequentially at a prescribed time resolution. The time interval of measuring the currents flowing in the electrical cables 14a-14c by the current signal measuring parts 38a-38c is set at, e.g., about 200 μs. The currents flowing in the electrical cables 14a-14c are measured at such time interval, whereby current signals (current signal data) of a sufficient time resolution can be obtained.

The measurement of the currents by the current signal measuring parts 38a-38c is controlled by the control part 34. The control part 34 controls the voltage signal measuring parts 32a-32c and the current signal measuring parts 38a-38c so that the measurement of the voltage by the voltage signal measuring parts 32a-32c and the measurement of the currents by the current signal measuring parts 38a-38c are synchronized. The current signal measuring parts 38a-38c obtained current signal data according to a command from the control part 34, and outputs the obtained current signal data to the control part 34.

The control part 34 outputs the current signal data obtained by the current signal measuring parts 38a-38c to the processing part (data analyzing part, power computing part, computing part) 36.

The processing part 36 stores the obtained voltage signal data and the obtained current signal data in a storage part (data base) 39. As the storage part 39, a memory such as, e.g., RAM (Random Access Memory), HDD (Hard Disc Drive) or others can be used.

The processing part 36 computes, by using the obtained current signal data and the obtained voltage signal data, power (effective power) as will be described later. The data of power values computed by the processing part 36 is stored in the storage part 39.

The processing part 36 is connected to a communication part 40. The communication part 40 can send and receive the data of power values computed by the processing part 36 to and from other apparatus (not illustrated). For example, the communication part 40 can communicate with other apparatus via networks, such as LANs (Local Area Networks), internets, etc.

In the alternating current power measuring apparatus according to the present embodiment, a switch (switching part) 42 for switching the measuring circuits is provided.

Figure 3:
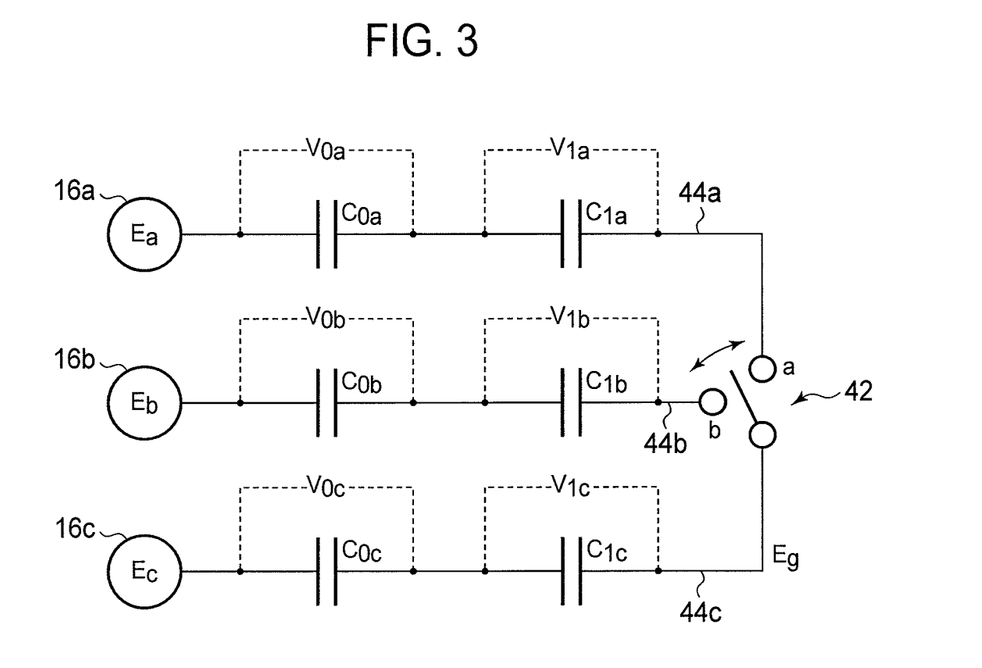
FIG. 3 is a view of a part of the circuit of the alternating current power measuring apparatus according to the embodiment.

FIG. 3 is a view of a part of the circuit of the alternating current power measuring apparatus according to the present embodiment.

$E_a$ represents an electric potential of the conductor wire 16a of the electrical cable 14a. $E_b$ represents an electric potential of the conductor wire 16b of the electrical cable 14b. $E_c$ represents an electric potential of the conductor wire 16c of the electrical cable 14c. $E_g$ represents an electric potential of the common line 44c connected to the switch 42.

$C_{0a}$ represents a capacitance between the electrode 26 of the clamp part 11a and the conductor wire 16a of the electrical cable 14a. $C_{0b}$ represents a capacitance between the electrode 26 of the clamp part 11b and the conductor wire 16b of the electrical cable 14b. $C_{0c}$ represents a capacitance between the electrode 26 of the clamp part 11c and the conductor wire 16c of the electrical cable 14c.

$C_{1a}$ represents a capacitance of the capacitance element 30a. $C_{1b}$ represents a capacitance of the capacitance element 30b. $C_{1c}$ represents a capacitance of the capacitance element 30c.

$V_{0a}$ represents a voltage between the electrode 26 of the clamp part 11a and the conductor wire 16a of the electrical cable 14a. $V_{0b}$ represents a voltage between the electrode 26 of the clamp part 11b and the conductor wire 16b of the electrical cable 14b. $V_{0c}$ represents a voltage between the electrode 26 of the clamp part 11c and the conductor wire 16c of the electrical cable 14c.

$V_{1a}$ represent a voltage of both ends of the capacitance element 30a. $V_{1b}$ represents a voltage of both ends of the capacitance element 30b. $V_{1c}$ represents a voltage of both ends of the capacitance element 30c.

Figure 4A:
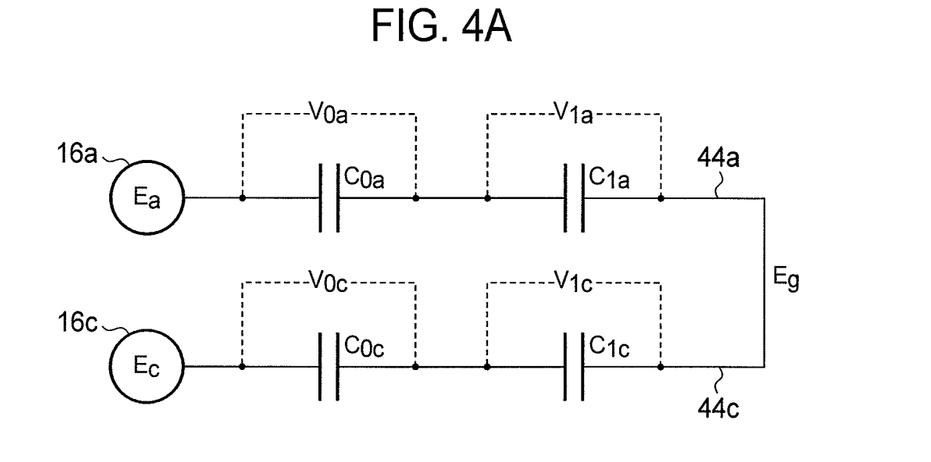
FIGS. 4A and 4B are circuit diagrams with the contact of the switch positioned on the a-side or the b-side.

FIG. 4A is a circuit diagram with the contact of the switch 42 positioned on the a-side. With the contact of the switch 42 positioned on the a-side, the circuit associated with the contact b is electrically disconnected, and in FIG. 4A, the circuit associated with the contact b is omitted.

With the contact of the switch 42 positioned on the a-side, one end of the capacitance element 30a and one end of the capacitance element 30c are electrically connected to each other by interconnections 44a, 44c.

In such circuit, Formula (1) described below is established.

$$C_{0a}V_{0a}=C_{1a}V_{1a}=-C_{1c}V_{1c}=-C_{0c}V_{0c} \quad (1)$$

Formula (2) described below is also established.

$$E_a-E_c=V_{0a}+V_{1a}-V_{1c}-V_{0c} \quad (2)$$

Formula (3) described below can be derived from Formula (1) and Formula (2).

$D_{0a}$ is the inverse number of $C_{0a}$; $D_{1a}$ is the inverse number of $C_{1a}$; $D_{0c}$ is the inverse number of $C_{0c}$; and $D_{1c}$ is the inverse number of $C_{1c}$.

$$V_{1a}-V_{1c}=\{(D_{1a}+D_{1c})/(D_{0a}+D_{1a}+D_{0c}+D_{1c})\}\times(E_a-E_c) \quad (3)$$

As seen in Formula (3), $(V_{1a}-V_{1c})$ and $(E_a-E_c)$ have proportional relationship. It is seen that because of the proportionality between $(V_{1a}-V_{1e})$ and $(E_a-E_c)$, the contact of the switch 42 is positioned on the a-side, whereby power can be given, based on $(V_{1a}-V_{1c})$.

Figure 4B:
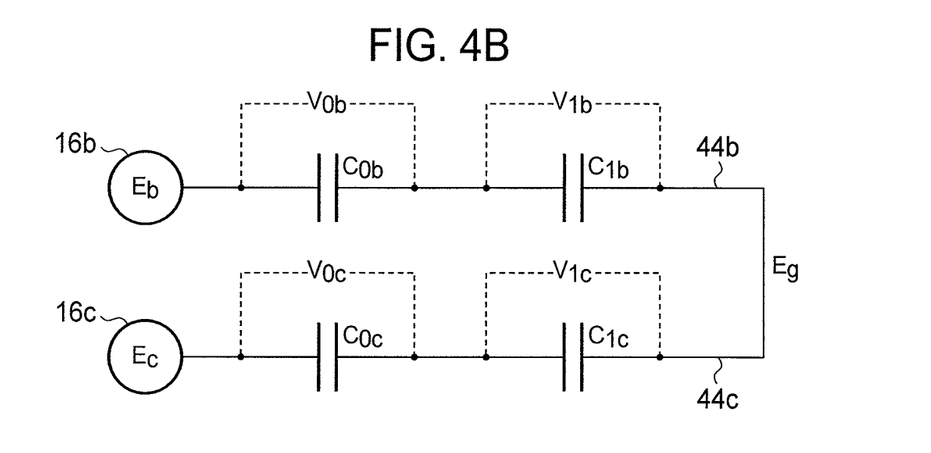

FIG. 4B is the circuit diagram with the contact of the switch 42 positioned on the b-side. With the contact of the switch 42 positioned on the b-side, the circuit associated with the contact a is electrically disconnected, and in FIG. 4B, the circuit associated with the contact a is omitted.

With the contact of the switch 42 positioned on the b-side, one end of the capacitance element 30b and one end of the capacitance element 30c are electrically connected to each other by interconnections 44b, 44c.

In such circuit, Formula (4) described below is established.

$$C_{0b}V_{0b}=C_{1b}V_{1b}=-C_{1c}V_{1c}=-C_{0c}V_{0c} \quad (4)$$

Formula (5) described below is also established.

$$E_b-E_c=V_{0b}+V_{1b}-V_{1c}-V_{0c} \quad (5)$$

From Formula (4) and Formula (5), Formula (6) described below is derived.

$D_{0b}$ is the inverse number of $C_{0b}$; $D_{1b}$ is the inverse number of $C_{1b}$; $D_{0c}$ is the inverse number of $C_{0c}$; and $D_{1c}$ is the inverse number of $C_{1c}$.

$$V_{1b}-V_{1c}=\{(D_{1b}+D_{1c})/(D_{0b}+D_{1b}+D_{0c}+D_{1c})\}(E_b-E_c) \quad (6)$$

As seen in Formula (6), $(V_{1b}-V_{1b})$ and $(E_b-E_c)$ have proportional relationship. It is seen that because of the proportional relationship between $(V_{1b}-V_{1c})$ and $(E_b-E_c)$, the contact of the switch 42 is positioned on the b-side, whereby power can be given, based on $(V_{1b}-V_{1c})$.

In the present embodiment, the ends of the capacitance elements 30a-30c connected to the interconnections 44a-44c are not grounded. In other words, the ends of the capacitance elements 30a-30c connected to the interconnections 44a-44c are electrically floating.

The ends of the capacitance elements 30a-30c are not grounded in the present embodiment for the following reason.

Figure 5:
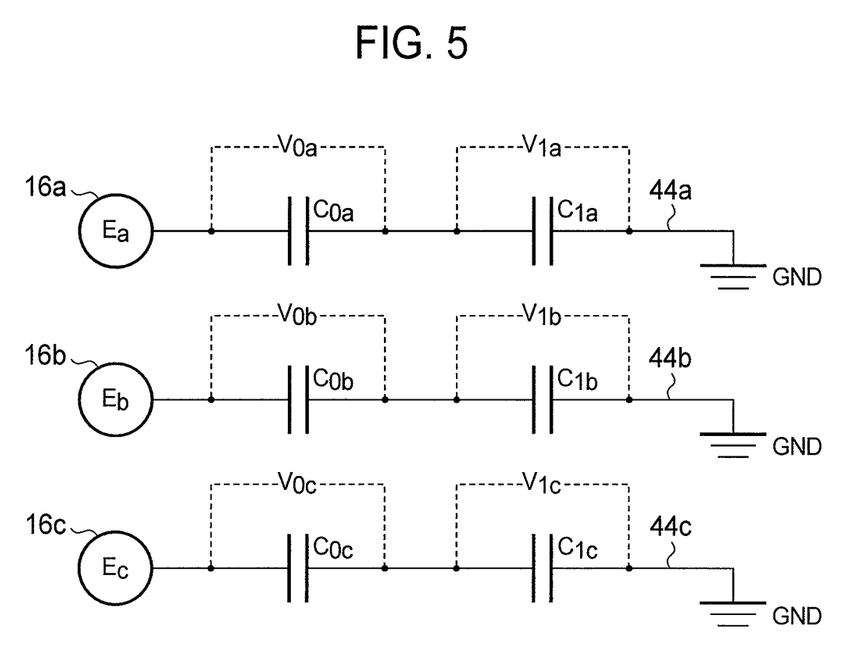
FIG. 5 is a circuit diagram with one ends of the capacitance elements respectively grounded.

FIG. 5 is a circuit diagram with one ends of the capacitance elements respectively grounded.

In such circuit, Formulas (7) to (14) described below is established.

$$C_{0a}V_{0a}=C_{1a}V_{1a} \quad (7)$$

$$C_{0b}V_{0b}=C_{1b}V_{1b} \quad (8)$$

$$C_{0c}V_{0c}=C_{1c}V_{1c} \quad (9)$$

$$E_a=V_{0a}+V_{1a} \quad (10)$$

$$E_b=V_{0b}+V_{1b} \quad (11)$$

$$E_c=V_{0c}+V_{1c} \quad (12)$$

$$V_{1a}-V_{1c}=D_{1a}/(D_{0a}+D_{1a})\times E_a-D_{1c}/(D_{0c}+D_{1c})\times E_c \quad (13)$$

$$V_{1b}-V_{1c}=D_{1b}/(D_{0b}+D_{1b})\times E_b-D_{1c}/(D_{0c}+D_{1c})\times E_c \quad (14)$$

As seen in Formula (13) and Formula (14), with the ends of the capacitance elements 30a-30c grounded, $(V_{1a}-V_{1e})$ and $(E_a-E_c)$ have not proportional relationship, and $(V_{1b}-V_{1c})$ and $(E_b-E_c)$ have not proportional relationship.

For example, when 20% scatter of the capacitances $C_{0a}-C_{0c}$ between the electrodes 26 of the clamp parts 11a-11c and the conductor wires 16a-16c of the electrical cables 14a-14c takes place, the following result is occurred.

That is, when $C_{0a}=1.2C_0$; $C_{0b}=0.8C_0$; $C_{0c}=1.0C_0$ and $C_{1a}=C_{1b}=C_{1c}=C_1$, the following result is occurred.

$$V_{1a}-V_{1c}=D_{1a}/(D_{0a}+D_{1a})\times E_a-D_{1c}/(D_{0c}+D_{1c})\times E_c \quad (15)$$
$$\approx C_0/C_1(1.2E_a-1.0E_c)$$

$$V_{1b}-V_{1c}=D_{1b}/(D_{0b}+D_{1b})\times E_b-D_{1c}/(D_{0c}+D_{1c})\times E_c \quad (16)$$
$$\approx C_0/C_1(0.8E_b-1.0E_c)$$

As seen in Formulas (15) and (16), the values of $(V_{1a}-V_{1e})$ and $(V_{1b}-V_{1c})$ largely scatter corresponding to scatters of the capacitances $C_{0a}-C_{0c}$ between the electrodes 26 of the clamp parts 11a-11c and the conductor wires 16a-16c of the electrical cables 14a-14c.

Accordingly, with one ends of the capacitance elements 30a-30c respectively grounded, it is difficult to give power, based on $(V_{1a}-V_{1e})$ and $(V_{1b}-V_{1c})$.

For such reason, in the present embodiment, the ends of the capacitance elements 30a-30c are not grounded.

In the present embodiment, the ends of the three capacitance elements 30a-30c are not commonly electrically grounded and have the connected circuits switched by the switch 42 for the following reason.

Figure 6:
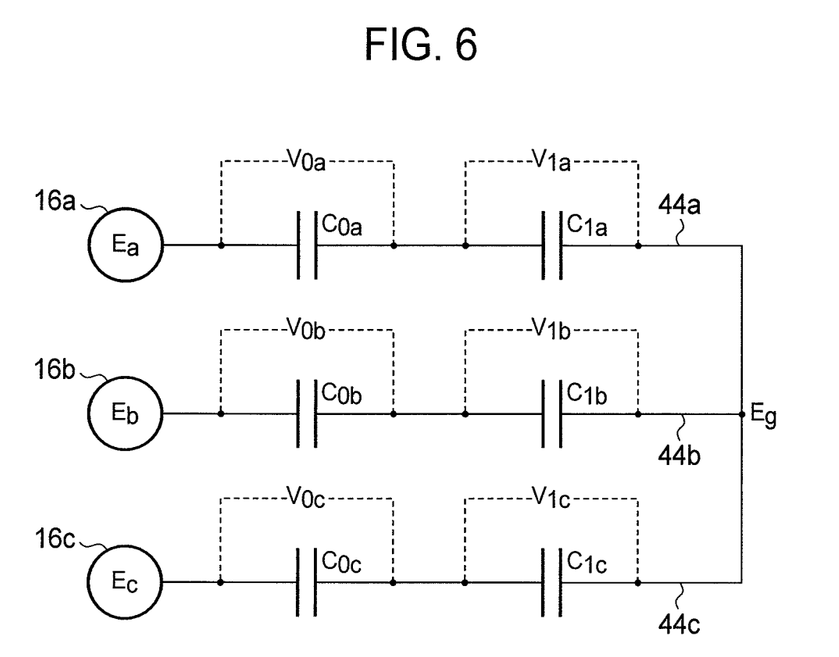
FIG. 6 is a circuit diagram with the ends of three capacitance elements electrically connected to each other.

FIG. 6 illustrates the circuit diagram with the ends of the three capacitance elements commonly electrically connected.

In such circuit, Formulas (17) to (24) are established.

$$C_{0a}V_{0a}=C_{1a}V_{1a} \quad (17)$$

$$C_{0b}V_{0b}=Cu_0V_{1b} \quad (18)$$

$$C_{0c}V_{0c}=C_{1c}V_{1c} \quad (19)$$

$$E_a-E_g=V_{0a}+V_{1a} \quad (20)$$

$$E_b-E_g=V_{0b}+V_{1b} \quad (21)$$

$$E_c-E_g=V_{0c}+V_{1c} \quad (22)$$

$$V_{1a}-V_{1c}=[(D_{1a}+D_{1c})(D_{0b}+D_{1b})\times E_a+\{D_{1c}(D_{0a}+D_{1a})D_{1a}(D_{0c}+D_{1c})\}E_b-D_{1c}(D_{0a}+D_{1a}+D_{0b}+D_{1b})E_c]/S \quad (23)$$

S is as follows here.

$$S = (D_{0a} + D_{1a})(D_{0b} + D_{1b}) + \quad (24)$$
$$(D_{0b} + D_{1b})(D_{0c} + D_{1c}) + (D_{0c} + D_{1c})(D_{0a} + D_{1a})$$

As seen in Formula (23), with the ends of the three capacitance elements 30a-30c commonly connected and electrically floating, $(V_{1a}-V_{1c})$ has not a proportional relationship with $(E_a-E_s)$, also has not a proportional relationship with $(E_b-E_s)$, and also has not a proportional relationship with $(E_a-E_b)$.

For example, when a 20% scatter takes place between the electrodes 26 of the clamp parts 11a-11c and the conductor wires 16a-16c of the electrical cables 14a-14c, the following result is occurred.

That is, when $C_{0a}=1.2C_0$, $C_{0b}=0.8C_0$ and $C_{0c}=1.0C_0$, and $C_{1a}=C_{1b}=C_{1c}=C_1$, the following result is occurred.

$$V_{1a} - V_{1c} = [(D_{1a} + D_{1c})(D_{0b} + D_{1b}) \times E_a + \{D_{1c}(D_{0a} + D_{1a}) - \quad (25)$$
$$D_{1a}(D_{0c} + D_{1c})\}E_b - D_{1c}(D_{0a} + D_{1a} + D_{0b} + D_{1b})E_c]/S$$
$$\approx (2/3) \times C_0/C_1(1.2E_a - 0.8E_b - 1.0E_c)$$

As seen in Formula (25), the value of $(V_{1a}-V_{1e})$ largely fluctuates corresponding to scatters of the capacitances $C_{0a}-C_{0c}$ between the electrodes 26 of the clamp parts 11a-11c and the conductor wires 16a-16c of the electrical cable 14a-14c. Similarly, the value of $(V_{1b}-V_{1c})$ largely fluctuates.

Thus, with the ends of the three capacitance elements 30a-30c connected to each other, it is difficult to give a power, based on $(V_{1a}-V_{1c})$ and $(V_{1b}-V_{1c})$.

For such reason, in the present embodiment, the ends of the three capacitance elements 30a-30c are not commonly connected.

Figure 7:
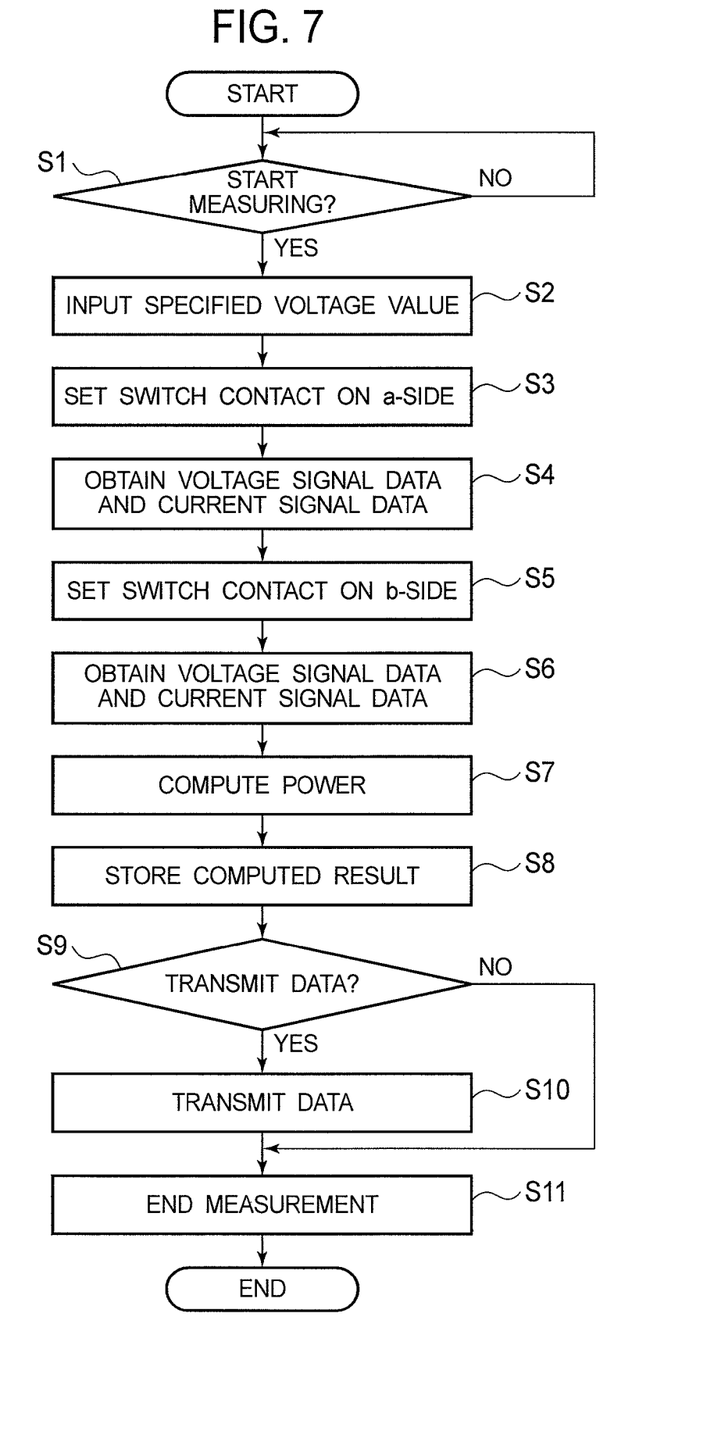
FIG. 7 is a flow chart of an alternating current power measuring method according to one embodiment.

Next, the alternating power measuring method according to the present will be described with reference to FIGS. 1 to 7. FIG. 7 is the flow chart of the alternating current power measuring method according to the present embodiment.

The method will be described by means of an example of measuring three-phase alternating current.

When power is measured, first, an operator turns on the measurement switch (not illustrated) provided in the alternating current power measuring apparatus (Step S1). Thus, the power measurement can be started.

Next, the operator inputs a specified voltage value $E_{eff}$ (Step S2). The specified voltage $E_{eff}$ is, e.g., an effective value. For three-phase alternating current, the effective voltage $E_{eff}$ is, e.g., 200 V. For single-phase alternating current, the specified voltage $E_{eff}$ is, e.g., 100 V. The specified voltage value $E_{eff}$ is inputted from an input part not illustrated. The inputted specified voltage vale $E_{eff}$ is inputted in the processing part 36. The inputted specified voltage value $E_{eff}$ may be indicated by an indication part not illustrated.

The specified voltage $E_{eff}$ is not limited to them. The specified voltage value $E_{eff}$ may be inputted suitably corresponding to a specified voltage of the power to be supplied to the electrical cables 14a-14b.

Then, the control part 34 sets the contact of the switch 42 on the a-side (Step S3). Thus, that of both ends of the capacitance element 30a opposite to the side of the clamp part 11a, and that of both ends of the capacitance element 30c opposite to the side of the clamp part 11c are electrically connected to each other by the interconnections 44a, 44c. The end of the capacitance element 30a and the end of the capacitance element 30c connected by the interconnections 44a, 44c are electrically floating. That is, the ends of the capacitance elements 30a, 30c are not connected to a fixed electrical potential, such as a ground potential, a power source potential or others.

With the contact of the switch 42 connected to the a-side, the control part 34 command the voltage signal measuring parts 32a, 32c to obtain voltage signal data and the current signal measuring parts 38a, 38c to obtain current signal data (Step S4). The voltage signal data obtained by the voltage signal measuring parts 32a, 32c, and the current signal data obtained by the current signal measuring parts 38a, 38c are outputted to the processing part 36 via the control part 34. The obtained voltage signal data and current signal data may be outputted from the voltage signal measuring parts 32a, 32c and the current signal measuring parts 38a, 38c directly to the processing part 36. The period time of obtaining the voltage signal data and the current signal data is set at at least one period or more. For the improvement of the measuring precision, preferably, voltage signal data and current signal data of plural periods are obtained. The processing part 36 commands the storage part 39 to store the thus obtained voltage signal data and current signal data.

Then, the control part 34 switches the contact of the switch 42 to the b-side (Step S5). Thus, that of both ends of the capacitance element 30b opposite to the clamp part 11b, and that of both ends of the capacitance element 30c opposite to the clamp part 11c are electrically connected to each other by the interconnections 44b, 44c. The end of the capacitance element 30b and the end of the capacitance element 30c connected by the interconnections 44b, 44c are electrically floating. That is, the ends of the capacitance elements 30b, 30c are not connected to a fixed electrical potential such as a ground potential, a power source potential or others.

With the contact of the switch 42 connected to the b-side, the control part 34 commands the voltage signal measuring parts 32b, 32c to obtain voltage signal data and the current signal measuring parts 38b, 38c to obtain current signal data (Step S6). The voltage signal data obtained by the voltage signal measuring parts 32b, 32c, and the current signal data obtained by the current signal measuring parts 38b, 38c are outputted to the processing part 36 via the control part 34. The obtained voltage signal data and current signal data may be outputted from the voltage signal measuring parts 32b,
32c and the current signal measuring parts 38b, 38c directly to the processing part 36. The period of time of obtaining the voltage signal data and current signal data is set at at least one period or more. For the improvement of the measuring precision, preferably, voltage signal data and current signal data of plural periods are obtained. The processing part 36 commands the storage part 39 to store the thus obtained voltage signal data and current signal data.

Next, the processing part 36 computes a power value P as follows by using the voltage signal data and the current signal data obtained as above.

First, the processing part 36 computes the first value $P_{ac}$ as described below by using the voltage signal data and the current signal data obtained with the contact of the switch 42 set on the a-side.

That is, the processing part 36 computes a voltage $V_{ac}$ between the end of the capacitance element 30a on the side of the clamp 11a and the end of the capacitance element 30c on the side of the clamp 11c. The voltage $V_{ac}$ can be obtained by Formula (26) described below.

$$V_{ac} = V_{1a} - V_{1c} \qquad (26)$$

wherein $V_{1a}$ is a voltage of both ends of the capacitance element 30a and is given by voltage signal data obtained by the voltage signal measuring part 32a. $V_{1c}$ is a signal of both ends of the capacitance element 30c and is given by voltage signal data obtained by the voltage signal measuring part 32c.

Formula (26) computes a voltage $V_{ac}$ between the end of the capacitance element 30a on the side of the clamp part 11a and the end of the capacitance element 30c on the side of the clamp part 11c and will be generally as follows.

That is, it can be considered that the capacitance element 30a and the capacitance element 30c serially connected is, as a whole, one capacitance element (capacitance part) formed by the capacitance elements 30a and the capacitance element 30c, and the voltage of both ends of such capacitance element is $V_{ac}$.

It is considered that the voltage signal measuring part 30a and the voltage signal measuring part 30c form, as a whole, one voltage signal measuring part, and such voltage signal measuring part measures $V_{ac}$.

The processing part 36 computes the effective value $V_{ac,eff}$ of a voltage between the end of the capacitance element 30a on the side of the clamp part 11a and the end of the capacitance element 30c on the side of the clamp part 11c, based on the voltage signal data of $V_{1a}$ and the voltage signal data of $V_{1c}$.

The $V_{ac,eff}$ is computed here, based on the voltage signal data of $V_{1a}$ and the voltage signal data $V_{1c}$, but, as a whole, it can be considered as follows.

That is, it is considered that the capacitance element 30a and the capacitance element 30c serially connected is, as a whole, one capacitance element (capacitance part) formed by the capacitance element 30a and the capacitance elements 30c, and the effective value of the voltage of both ends of such capacitance element is $V_{ac,eff}$.

It is considered that the voltage signal measuring part 30a and the voltage signal measuring part 30c form one voltage signal measuring part as a whole, and the effective value $V_{ac,eff}$ can be given, based on the voltage $V_{ac}$ measured by such voltage signal measuring part.

The processing part 36 gives the average value $P_{0,ac}$ of products between the voltage $V_{ac}$ and the current $I_a$ flowing in the electrical cable 14a. The $P_{0,ac}$ can be given by Formula (27) described below.

$$P_{0,ac} = (1/N)\Sigma(V_{ac} \times I_a) \qquad (27)$$

wherein Σ is the sign (summation sign) representing accumulation. N is a number of data to be accumulated. The accumulation is made for data of, e.g., one period. It is possible that data for plural periods are accumulated, and the average value is obtained.

The current $I_a$ flowing in the electrical cable 14a is given by the current signal data obtained by the current signal measuring part 38a.

The first value $P_{ac}$ is expressed by Formula (28) described below.

$$P_{ac} = P_{0,ac} \times E_{eff}/V_{ac,eff} \quad (28)$$

wherein $E_{eff}$ is a specified voltage value as described above.

The processing part 36 thus obtains the first value $P_{ac}$.

Next, The processing part 36 gives, as follows, the second value $P_{bc}$ described below by using the voltage signal data and the current signal data obtained with the switch 42 set on the b-side.

That is, first, the processing part 36 computes a voltage $V_{bc}$ between the end of the capacitance element 30b on the side of the clamp part 11b and the end of the capacitance element 30c on the side of the clamp part 11c. The voltage $V_{bc}$ can be obtained by Formula (29) described below.

$$V_{bc} = V_{1b} - V_{1c} \quad (29)$$

wherein $V_{1b}$ is a voltage of both ends of the capacitance element 30b and is represented by a voltage signal data obtained by the voltage signal measuring part 32b. $V_{1c}$ is a signal of both ends of the capacitance element 30c and is represented by a voltage signal data obtained by the voltage signal measuring part 32c.

Formula (29) subtracts the value of $V_{1c}$ from the value of $V_{1b}$ to thereby compute a voltage $V_{bc}$ between the end of the capacitance element 30b on the side of the clamp part 11b and the end of the capacitance element 30c on the side of the clamp part 11c and, as a whole, can be considered as follows.

That is, it can be considered that the capacitance element 30b and the capacitance element 30c serially connected is considered as a whole one capacitance element (capacitance part) formed by the capacitance element 30b and the capacitance element 30c, and the voltage of both ends of such capacitance element is $V_{bc}$.

It is considered that the voltage signal measuring part 30b and the voltage signal measuring part 30c forms as a whole, one voltage signal measuring part, and the $V_{bc}$ is measured by such voltage signal measuring part.

The processing part 36 computes an effective value $V_{bc,eff}$ of the voltage between the end of the capacitance element 30b on the side of the clamp part 11b and the end of the capacitance element 30c on the side of the clamp part 11c, based on the voltage signal data of $V_{1b}$ and the voltage signal data of $V_{1c}$.

$V_{bc,eff}$ is computed here, based on the voltage signal data of $V_{1b}$ and the voltage signal data of $V_{1c}$ here, and, as a whole, it is considered as follows.

That is, it is considered that the capacitance element 30b and the capacitance element 30c serially connected is, as a whole, one capacitance element (capacitance part) formed by the capacitance element 30b and the capacitance element 30c, and the effective value of the voltages of both ends of such capacitance element is $V_{bc,eff}$.

It is considered that the voltage signal measuring part 30b and the voltage signal measuring part 30c form one voltage signal measuring part as a whole, and the effective value $V_{bc,eff}$ is obtained, based on a voltage $V_{bc}$ measured by such voltage signal measuring part.

The processing part 36 gives the average value $P_{0,bc}$ of the product between the voltage $V_{bc}$ and the current $I_b$ flowing in the electrical cable 14b. $P_{0,bc}$ is expressed by Formula (30) described below.

$$P_{0,bc} = (1/N)\Sigma(V_{bc} \times I_b) \quad (30)$$

wherein Σ is the sign (summation sign) representing accumulation. N is a number of data to be accumulated. The accumulation is made for data of, e.g., one period. It is possible that data for plural periods are accumulated, and the average value is given.

The current $I_b$ flowing in the electrical cable 14b is represented by current signal data obtained by the current signal measuring part 38b.

The second value $P_{bc}$ is expressed by Formula (31) described below.

$$P_{bc} = P_{0,bc} \times E_{eff}/V_{bc,eff} \quad (31)$$

wherein $E_{eff}$ is a specified voltage value as described above.

The processing part 36 thus computes the second value $P_{bc}$.

Next, the processing part 36 computes the value of the power P of the three-phase alternating current.

The power P of the three-phase alternating current is expressed by formula (32) described below.

$$P = P_{ac} + P_{bc} \quad (32)$$

In Formula (32), the power P alone is physically significant. The first value $P_{ac}$ and the second value $P_{bc}$ are values computed for convenience and independently are physically insignificant.

The processing part 36 thus computes the power P of the three-phase alternating current.

Thus, the power P supplied by a set of the electrical cables 14a-14c is computed by the processing part 36. The data of the power value P computed by the processing part 36 is stored in the memory 28 (Step S8).

Next, when the computed result is transmitted to other apparatus, etc. (Step S9), the communication part 40 transmits the data of the power value P computed by the processing part 36 to other apparatus (not illustrated) (Step S10).

The alternating current power measuring apparatus according to the present embodiment can obtain the power factor as follows.

The alternating current power measuring apparatus according to the present embodiment can correctly obtain the power factor when the current values $I_a$-$I_c$ of the respective electrical cables 14a-14c are equal.

When a specified voltage value is $E_{eff}$, an effective value of the currents flowing in the electrical cables 14a-14c is $I_{eff}$, and a power factor is cos θ, Formula (33) described is established.

$$P = \sqrt{3} \times E_{eff} \times I_{eff} \times \cos\theta \quad (33)$$

Formula (34) described below is derived from Formula (33).

$$\cos\theta = P/\left(\sqrt{3} \times E_{eff} \times I_{eff}\right) = (P_{ac} + P_{bc})/\left(\sqrt{3} \times E_{eff} \times I_{eff}\right) \quad (34)$$

The processing part 36 computes the power factor cos θ based on, e.g., the Formula (34) described above.

The operator turns off the measuring switch, and the measurement is finished (Step S11). The processing part 36 indicates the measurement result on a display not illustrated.

Thus, the alternating current power measuring method according to the present embodiment is completed.

As described above, according to the present embodiment, with the contact of the switch 42 set on the a-side, one end of the capacitance element 30a is capacitively coupled to the conductor wire 16a of the electrical cable 14a, and one end of the capacitance element 30c is capacitively coupled to the conductor wire 16c of the electrical cable 14c. The capacitance elements 30a, 30c are electrically floating, and accordingly, a voltage $V_{ac}$ proportional to a voltage applied to the electrical cables 14a, 14c is applied to the capacitance elements 30a, 30c. Accordingly, the first value $P_{ac}$ can be computed by the multiplication among a proportion between a specified voltage value $E_{eff}$ and an effective value $V_{ac,eff}$ of the voltage of the capacitance elements 30a, 30c, the voltage $V_{ac}$ of the capacitance elements 30a, 30c, and the current $I_a$ flowing in the electrical cable 14a. With the switch 42 set on the b-side, one end of the capacitance element 30b is capacitively coupled to the conductor wire 16b of the electrical cable 14b, and one end of the capacitance element 30c is capacitively coupled to the conductor wire 16c of the electrical cable 14c. The capacitor elements 30b, 30c are electrically floating, and accordingly a voltage $V_{bc}$ proportional to a voltage applied to the electrical cables 14b, 14c is applied to the capacitance elements 30b, 30c. Accordingly, the second value $P_{bc}$ can be computed by the multiplication among a proportion between the specified voltage value $E_{eff}$, an effective value $V_{bc,eff}$ of the voltage of the capacitance elements 30b, 30c, the voltage $V_{bc}$ of the capacitance elements 30b, 30c, and the current $I_b$ flowing in the electrical cable 14b. The first value $P_a$, and the second value $P_{bc}$ are added, whereby a power applied by the electrical cables 14a-14c can be computed without contacting the conductor wires 16a-16c of the electrical cables 14a-14c.

Modified Embodiments

The present invention is not limited to the above-described embodiment and can cover other various modifications.

For example, in the above-described embodiment, a case that the measuring of the power of the three-phase alternating current is exemplified but it is not limited to this. For example, single-phase alternating current can be obtained. In the case that the electrical cables which supply single-phase alternating current are the electrical cable 14a and the electrical cable 14c illustrated in FIG. 1, the clamp parts 11a, 11c clamp respectively the electrical cable 14a, 14c. In this case, the clamp part 11b clamps, e.g., the electrical cable 14c. This is because in the case that the clamp part 11b clamps neither of the electrical cables, the voltage becomes unknown, and there is the possibility that the second value $P_{bc}$ might not become 0. The power P of the single-phase alternating current to be supplied by a set of the electrical cables 14a, 14c is given by the first value $P_{ac}$ described above (see Formula (28)). The power P may be obtained, as in Formula (32) described above, by the summation of the first value $P_{ac}$ and the second value $P_{bc}$. Even if the power P is obtained by the summation of the first value $P_{ac}$ and the second value $P_{bc}$, the power P of the single-phase alternating current to be supplied by a set of the electrical cables 14a, 14c can be accurately measured because the second value $P_{bc}$ becomes 0. Thus, the alternating current power measuring apparatus according to the present embodiment can obtain the power of single-phase alternating current.

In the above-described embodiment, a case that the three input circuits 10a-10c is provide is exemplified but it is not limited to this. For example, in the case that the power of single-phase alternating current is measured, two input circuits suffice. In the case that single-phase alternating current is supplied by the electrical cable 11a and the electrical cable 11c, the input circuit 10b, for example, may not be provided. In this case, the switch 42 may not be provided. In this case, the end of both ends of the capacitance element 30a on the side opposite to the clamp part 11a, and the end of both ends of the capacitance element 30c on the side opposite to the clamp part 11c are electrically connected with an interconnection. In this case as well, the end of the both ends of the capacitance elements 30a on the side opposite to the clamp part 11a, and the end of both ends of the capacitance element 30c on the side opposite to the clamp part 11c are electrically floating. That is, the end of both ends of the capacitance element 30a on the side opposite to the clamp part 11a and the end of both ends of the capacitance element 30c on the side opposite to the clamp part 11c are not connected to a fixed electrical potential, such the earth potential, a power supply potential or others. The power P of the single-phase current supplied by one set of the electrical cables 14a, 14c is obtained by the first value $P_{ac}$ described above (see Formula (28)). Thus, when the power P of single-phase alternating current is obtained, the number of the input circuit may be two.

In the above-described embodiment, a case that the capacitance elements 30a-30c is provided in each input circuit is exemplified but it is not limited to this. For example, the capacitance element 30c may not be provided. In the case that the capacitance element 30c is not provided, the voltage signal measuring part 32c may not be provided. In the case that the capacitance element 30c is not provided, with the contact of the switch 42 positioned on the a-side, the end of both ends of the capacitance element 30a on the side opposite to the clamp part 11a is electrically connected to the electrode 26 of the clamp part 11c. Accordingly, the end of both ends of the capacitance element 30a on the side opposite to the clamp 11a is capacitively coupled to the conductor wire 16c of the electrical cable 14c not via the capacitance element 30c. In this case, the voltage signal data of a voltage $V_{1a}$ of both ends of the capacitance element 30a obtained by the voltage signal measuring part 32a is the data of $V_{ac}$. The effective value of the voltage $V_{1a}$ of both ends of the capacitance element 30a obtained by the voltage single measuring part 32a is the value of $V_{ac,eff}$. With the contact of the switch 42 positioned on the b-side, the end of both ends of the capacitance element 30b on the side opposite to the clamp part 11b is electrically connected to the electrode 26 of the clamp part 11b. The end of both ends of the capacitance element 30b on the side opposite to the clamp part 11b is capacitively coupled to the conductor wire 16c of the electrical cable 14c not via the capacitance element 30c. In this case, the voltage signal data of a voltage $V_{1b}$ of both ends of the capacitance element 30b obtained by the voltage signal measuring part 32b is the data of $V_{bc}$. The effective value of $V_{1b}$ of both ends of the capacitance element 30b obtained by the voltage signal measuring part 32b is the value of $V_{bc,eff}$.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An alternating current power measuring apparatus comprising:
   a first capacitance element having one end capacitively coupled to a conductor wire of a first electrical cable of a set of electrical cables for supplying alternating current to a load and having the other end capacitively coupled to a conductor wire of a second electrical cable of the set of electrical cables;
   a first voltage measuring part for measuring a first voltage V which is a voltage of both ends of the first capacitance element;
   a first current measuring part for measuring a first current I flowing in the first electrical cable; and
   a processing part which accepts a value of $E_{eff}$ being a standard voltage, accumulates N measurements of first voltage V and first current I over a predetermined period, and then computes a power P to be supplied to the load by the set of electrical cables according to the following formula:

$$P = P_0 \times E_{eff}/V_{eff}$$

wherein $P_0$ is given by the following formula:

$$P_0 = (1/N)\Sigma(V \times I)$$

$\Sigma$ being the summation sign representing accumulation of the N measurements, and
   $V_{eff}$ being the effective value of the first voltage V for the predetermined period.

2. An alternating current power measuring apparatus comprising:
   a first capacitance element having one end capacitively coupled to a conductor wire of a first electrical cable of a set of three electrical cables for supplying three-phase alternating current to a load and having the other end capacitively coupled to a conductor wire of a second electrical cable of the set of electrical cables;
   a second capacitance element having one end capacitively coupled to a conductor wire of a third electrical cable of the set of electrical cables and having the other end capacitively coupled to the conductor wire of the second electrical cable;
   a first voltage measuring part for measuring a first voltage $V_{ac}$ which is a voltage of both ends of the first capacitance element;
   a second voltage measuring part for measuring a second voltage $V_{bc}$ which is a voltage of both ends of the second capacitance element;
   a first current measuring part for measuring a first current $I_a$ flowing in the first electrical cable;
   a second current measuring part for measuring a second current $I_b$ flowing in the second electrical cable;
   a switching part for capacitively coupling selectively either of said the other end of the first capacitance element and said the other end of the second capacitance element to the second electrical cable; and
   a processing part which accepts values of $E_{ac,eff}$ and $E_{bc,eff}$ being a standard voltage, accumulates N measurements of $V_{ac}$, $V_{bc}$, $I_a$ and $I_b$ over a predetermined period, and then computes a power to be supplied to the load by the set of electrical cables by summation of a first value $P_{ac}$ and a second value $P_{bc}$, which are determined according to the following formulas:

$$P_{0,ac} = (1/N)\Sigma(V_{ac} \times I_a)$$

$\Sigma$ being the summation sign representing accumulation of the N measurements, $$P_{ac} = P_{0,ac} \times E_{ac,eff}/V_{ac,eff}$$

$V_{ac,eff}$ being the effective value of the first voltage $V_{ac}$ for the predetermined period $$P_{0,bc} = (1/N)\Sigma(V_{bc} \times I_b)$$

$\Sigma$ being the summation sign representing accumulation of the N measurements, and $P_{bc} = P_{0,bc} \times E_{bc,eff}/V_{bc,eff}$
   $V_{bc,eff}$ being the effective value of the first voltage $V_{bc}$ for the predetermined period.

3. An alternating current power measuring apparatus according to claim 1, further comprising:
   a first clamp part including a first electrode, a first magnetic core and a first coil wound around the first magnetic core and bringing the first electrode adjacent to an insulator of the first electrical cable; and
   a second clamp part including a second electrode, a second magnetic core and a second coil wound around the second magnetic core and brining the second electrode adjacent to an insulator of the second electrical cable,
   said one end of the first capacitance element being capacitively coupled to the conductor wire of the first electrical cable via the first electrode,
   said the other end of the first capacitance element being capacitively coupled to the conductor wire of the second electrical cable via the second electrode, and
   the first current measuring part detecting a current flowing in the first electrical cable or in the second electrical cable, based on a signal detected by the first coil or the second coil.

4. An alternating current power measuring apparatus according to claim 2, further comprising:
   a first clamp part including a first electrode, a first magnetic core and a first coil wound around the first magnetic core and bringing the first electrode adjacent to an insulator of the first electrical cable; and
   a second clamp part including a second electrode, a second magnetic core and a second coil wound around the second magnetic core and brining the second electrode adjacent to an insulator of the second electrical cable,
   said one end of the first capacitance element being capacitively coupled to the conductor wire of the first electrical cable via the first electrode,
   said the other end of the first capacitance element being capacitively coupled to the conductor wire of the second electrical cable via the second electrode, and
   the first current measuring part detecting a current flowing in the first electrical cable or in the second electrical cable, based on a signal detected by the first coil or the second coil.

5. An alternating current power measuring apparatus according to claim 4, further comprising
   a third clamp part including a third electrode, a third magnetic core and a third coil wound around the third magnetic core and bring the third electrode adjacent to the insulator of the third electrical cable,
   said one end of the second capacitance element being capacitively coupled to the conductor wire of the third electrical cable via the third electrode, and
   the second current measuring part detecting a current flowing in the second electrical cable or in the third electrical cable, based on a signal detected by the second coil or the third coil.

6. An alternating current power measuring apparatus according to claim 1, wherein
an input impedance of the first voltage measuring part is twice or more of an impedance of the first capacitance element.

7. An alternating current power measuring apparatus according to claim 2, wherein
an input impedance of the first voltage measuring part is twice or more of an impedance of the first capacitance element.

8. An alternating current power measuring apparatus according to claim 6, wherein
an input impedance of the first voltage measuring part is five times or more of an impedance of the first capacitance element.

9. An alternating current power measuring apparatus according to claim 7, wherein
an input impedance of the first voltage measuring part is five times or more of an impedance of the first capacitance element.

* * * * *